US006734716B2

United States Patent
Amick et al.

(10) Patent No.: US 6,734,716 B2
(45) Date of Patent: May 11, 2004

(54) SSTL PULL-DOWN PRE-DRIVER DESIGN USING REGULATED POWER SUPPLY

(75) Inventors: Brian W. Amick, Austin, TX (US); Lynn Warriner, Round Rock, TX (US); Claude R. Gauthier, Cupertino, CA (US); Tri Tran, San Leandro, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/247,127

(22) Filed: Sep. 19, 2002

(65) Prior Publication Data

US 2004/0056700 A1 Mar. 25, 2004

(51) Int. Cl.[7] .............................. G05F 1/10; G05F 3/02
(52) U.S. Cl. ...................................... 327/530; 327/538
(58) Field of Search .............................. 327/317–319, 327/322, 328, 333, 530, 538–546; 326/80, 81

(56) References Cited

U.S. PATENT DOCUMENTS

| 5,317,201 | A | * | 5/1994 | Takayanagi | 327/77 |
|---|---|---|---|---|---|
| 6,018,265 | A | * | 1/2000 | Keshtbod | 327/540 |
| 6,057,676 | A | * | 5/2000 | Lee et al. | 323/316 |
| 6,265,926 | B1 | * | 7/2001 | Wong | 327/318 |
| 6,384,628 | B1 | * | 5/2002 | Lacey et al. | 326/41 |
| 6,462,602 | B1 | * | 10/2002 | Potter | 327/333 |

OTHER PUBLICATIONS

Stub Series Terminated Logic for 2.5 V (SSTL_2) A 2.5 V Supply Voltage Based Interface Standard for Digital Integrated Circuits; JESD8–9A, Dec. 2000, JEDEC Solid State Technology Association (22 pages).

* cited by examiner

*Primary Examiner*—My-Trang Nuton
(74) *Attorney, Agent, or Firm*—Osha Novak & May L.L.P.

(57) ABSTRACT

A SSTL memory interface pre-driver stage that uses a voltage regulator to generate a 'virtual' supply is provided. The 'virtual' supply, being lower than a power supply voltage of the pre-driver stage, allows low voltage transistors to be used, thereby improving interface performance and decreasing system power consumption. The pre-driver stage uses a biasing circuit to bias the voltage regulator, formed by a transistor arranged in a source follower configuration, to generate the 'virtual' supply off which a voltage translator stage of the pre-driver stage operates to generate an output of the pre-driver stage.

20 Claims, 6 Drawing Sheets

US 6,734,716 B2

SSTL PULL-DOWN PRE-DRIVER DESIGN USING REGULATED POWER SUPPLY

BACKGROUND OF INVENTION

As shown in FIG. 1, a typical computer system 10 includes at least a microprocessor 12 (often referred to and known as "CPU") and some form of memory 14. The microprocessor 12 has, among other components, arithmetic, logic, and control circuitry that interpret and execute instructions necessary for the operation and use of the computer system 10. Specifically, FIG. 1 shows the computer system 10 having the microprocessor 12, memory 14, integrated circuits (ICs) 16 that have various functionalities, and communication paths 19, i.e., buses and wires, that are necessary for the transfer of data among the aforementioned components of the computer system 10.

In order to keep pace with improving technologies, computer system and circuit designers are constantly trying to improve and get the most out of their designs through the most cost-effective means. As faster versions of a particular CPU become available, a designer will often try to improve the throughput of their existing design by simply increasing the CPU clock frequency. However, after a certain point, the speed of the system's main memory becomes a limiting factor in optimizing the throughput of the system. To this end, designers have produced faster memories, which, in turn, has necessitated high-speed memory interfaces.

One type of design that has been used for high-speed memory interface applications involves the use of stub series termination logic (SSTL). SSTL is a standard created by the Joint Electron Device Engineering Council (JEDEC) to provide a termination scheme for high speed signaling in applications such as DDR-SDRAM. SSTL specifies particular switching characteristics such that high operating frequencies are available. As operating frequencies continue to increase and as the demand for faster memory interfaces has and continues to grow, the STTL interface standard continues to enjoy wide acceptance.

SUMMARY OF INVENTION

According to one aspect of the present invention, an integrated circuit comprises: a biasing circuit arranged to generate a bias signal; a voltage regulator arranged to receive the bias signal and generate a regulated voltage on a terminal thereof; and a voltage translator stage, operatively connected to the terminal, arranged to output a voltage dependent on an input thereto, where the regulated voltage is arranged to serve as a power supply for the voltage translator stage, and where the regulated voltage is less than a power supply voltage of the voltage regulator.

According to another aspect, an integrated circuit comprises: means for generating a bias signal; means for generating a regulated voltage dependent on the bias signal; and means for outputting a signal dependent on an input to the means for outputting the signal, where the means for outputting the signal is dependent on the regulated voltage, and where a maximum voltage of the signal is less than a supply voltage of the means for generating the regulated voltage.

According to another aspect, a method for performing a stub series termination logic operation comprises: generating a bias signal dependent on a power supply voltage; generating a regulated voltage dependent on the bias signal and the power supply voltage; and generating an output signal dependent on an input signal, where the generating the output signal is dependent on the regulated voltage, and where the regulated voltage is less than the power supply voltage.

According to another aspect, an integrated circuit having a core and a memory comprises stub series termination logic circuitry interfaced between the core and the memory, where the stub series termination logic circuitry is arranged to operate off of a power supply voltage, and where the stub series termination logic circuitry comprises: a pre-driver stage arranged to receive an input signal from the core, where the pre-driver stage includes a voltage regulator arranged to operate off of the power supply voltage and generate a regulated voltage on a terminal thereof and a voltage translator stage, operatively connected to the terminal, arranged to output an output signal dependent on the input signal and the regulated voltage; and an output buffer stage arranged to receive and buffer the output signal.

Other aspects and advantages of the invention will be apparent from the following description and the appended claims.

DETAILED DESCRIPTION

In circumstances when a memory interface using SSTL technology is integrated on-chip, there is a likelihood that the supply voltage for the SSTL interface will exceed the voltage tolerances of low-voltage transistors that are designed to operate at voltages below that of the SSTL interface. If a large voltage is placed across one of these low-voltage transistors, the gate oxide layer of the transistor may break down, which, in turn, could cause circuit malfunction.

The present invention uses a voltage regulator device in a pre-driver stage of a SSTL interface to generate a "virtual power supply" off which particular circuitry operates to generate a low voltage swing signal dependent on an input to pre-driver stage from a core portion of a microprocessor, where the pre-driver stage operates off of a supply voltage greater than the "virtual power supply."

Figure 1:
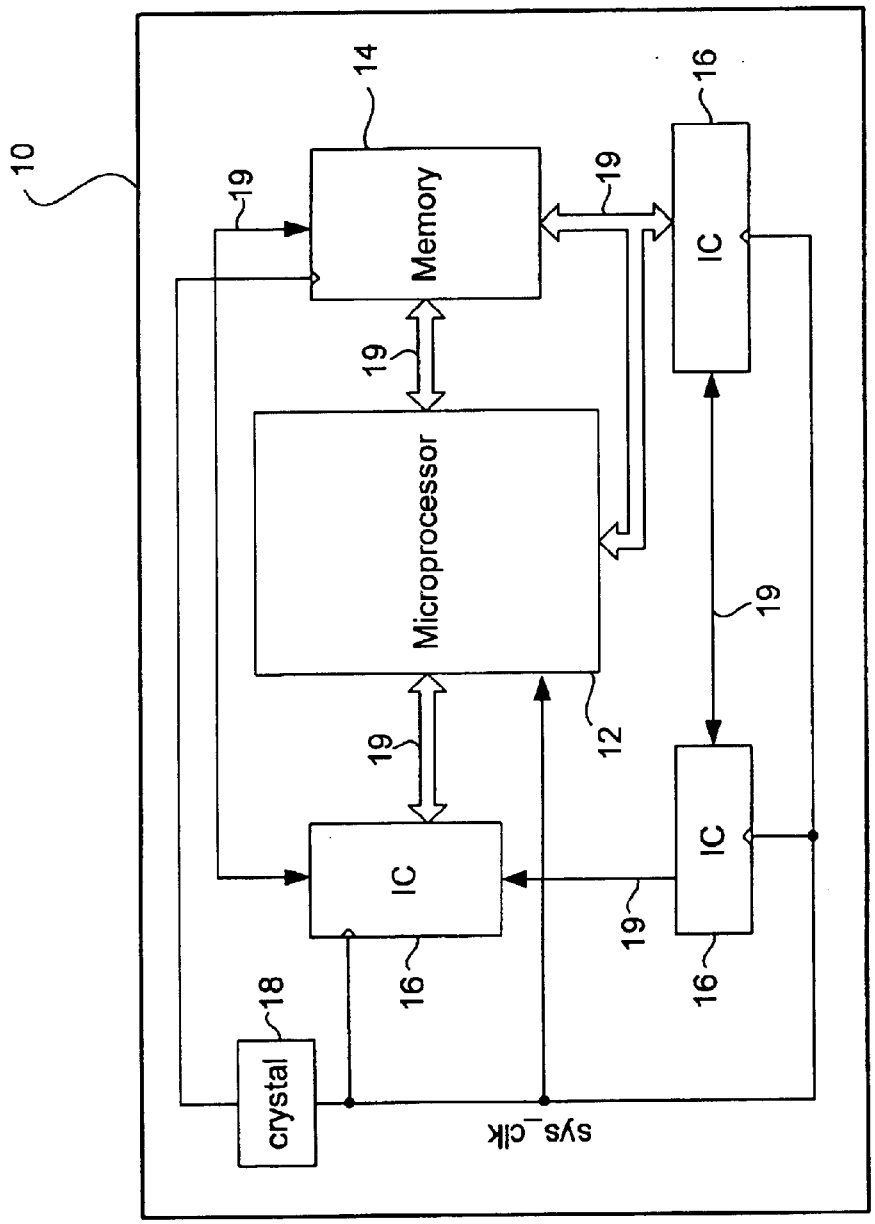
FIG. 1 shows a typical computer system.
Figure 2:
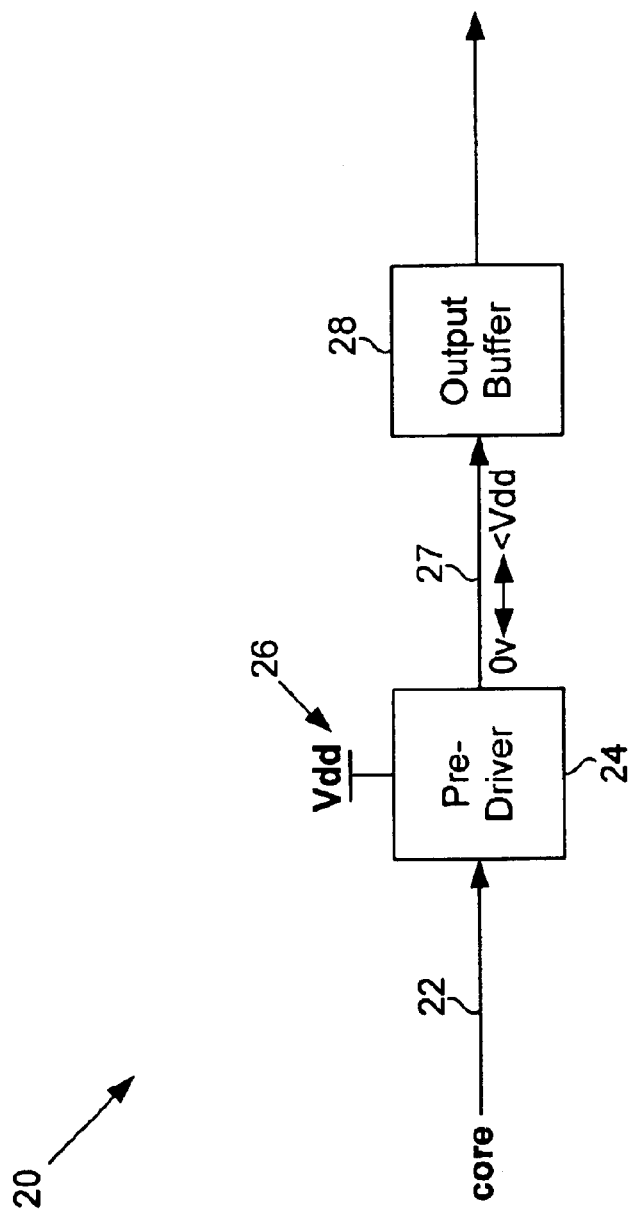
FIG. 2 shows a memory interface in accordance with an embodiment of the present invention.

FIG. 2 shows a block diagram of a SSTL interface 20 in accordance with an embodiment of the present invention. In FIG. 2, a core signal, core 22 (from a core region (not shown) of the microprocessor on which the SSTL interface 20 is implemented) having a logic value of '0' or '1' serves an input to a pre-driver stage 24 that operates off of a supply voltage Vdd 26 (I/O power supply voltage). However, due to the types of transistors (not shown) used in the SSTL interface 20, the supply voltage Vdd 26 cannot be placed on the transistors (not shown) without damaging them. Accordingly, the pre-driver stage 24, using a voltage regulator (not shown) (described in detail below with reference to FIGS. 3 and 4) generates a "virtual power supply," or regulated voltage, that facilitates the generation of a low voltage swing signal 27 to an output buffer stage 28, where the low voltage swing signal 27 has a voltage swing between 0 and a voltage value less than Vdd 26. Thus, the pre-driver stage 24 may be referred to as a "pull-down pre-driver." Those skilled in the art will understand that the pre-driver stage 24 must provide some gain to the output buffer stage 28 due to the fact that output buffer stage 28 itself may be very large and complex.

Figure 3:
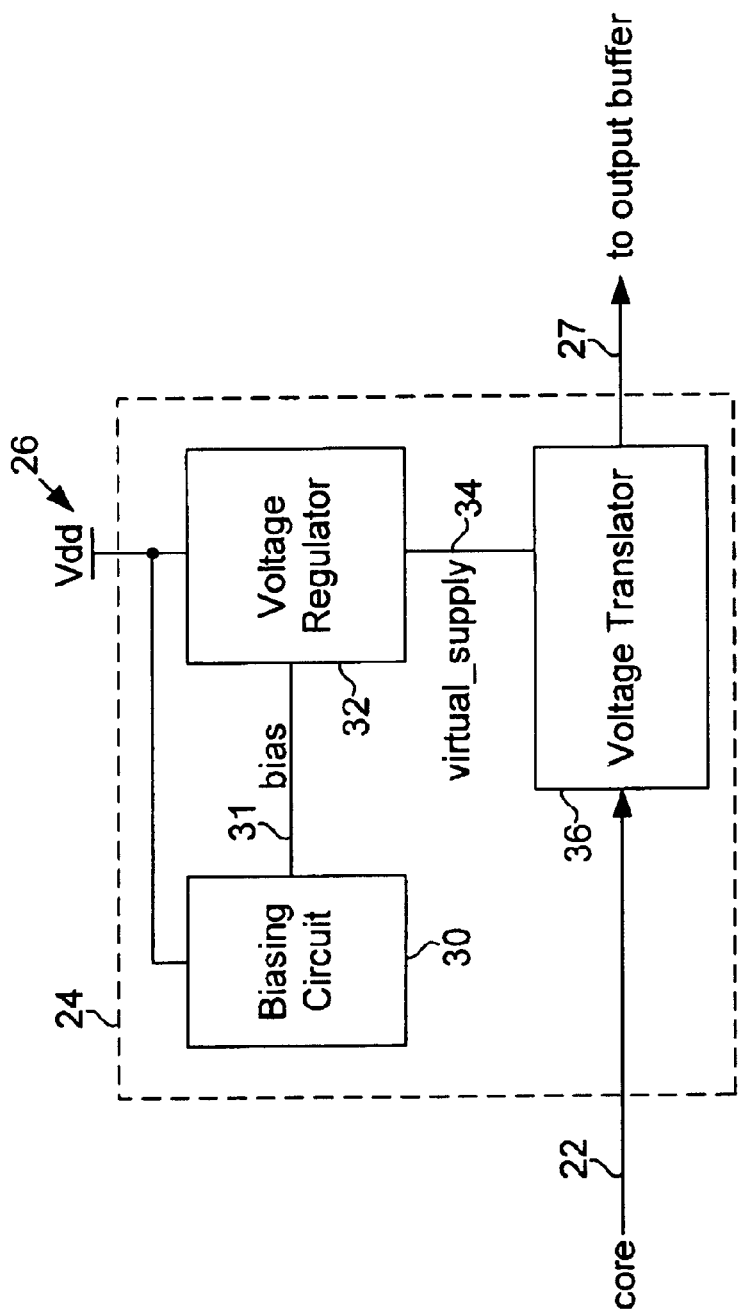
FIG. 3 shows a block diagram of a pre-driver stage in accordance with an embodiment of the present invention.

FIG. 3 shows a block diagram of a SSTL pre-driver stage 24 in accordance with an embodiment of the present invention. In FIG. 3, the pre-driver stage 24 includes a biasing circuit 30, a voltage regulator 32, and a voltage translator stage 36. The biasing circuit 30 generates a bias signal, bias 31, that is used to bias the voltage regulator 32. The voltage regulator 32, operating off of Vdd 26 and dependent on the bias signal 31, generates a regulated or 'virtual' power supply voltage, virtual_supply 34, off which the voltage translator stage 36 operates. This 'virtual' power supply voltage 34 is less than Vdd 26 and is used by the voltage translator stage 36 to generate a low voltage swing signal 27 to the output buffer stage (28 in FIG. 2) dependent on the input core signal (22 in FIG. 2). As described below with reference to FIG. 4, the voltage regulator 32 is arranged to maintain the voltage on the 'virtual' supply 34 even when the voltage translator stage 36 draws current from the voltage regulator 32.

Figure 4:
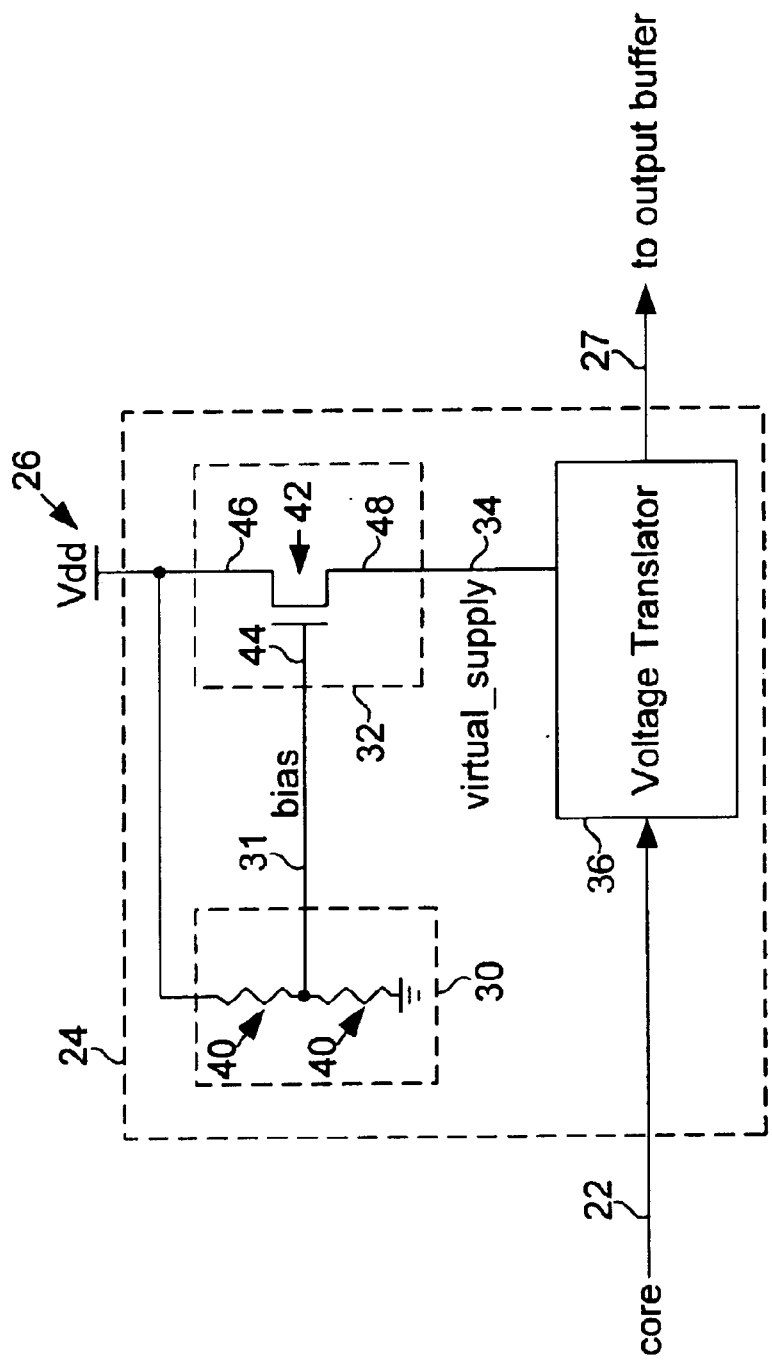
FIG. 4 shows a circuit diagram of a pre-driver stage in accordance with an embodiment of the present invention.

FIG. 4 shows a circuit diagram of a SSTL pre-driver stage 24 in accordance with an embodiment of the present invention. In FIG. 4, the biasing circuit 30 includes a plurality of resistors 40 that form a voltage divider that generates the bias signal 31 to the voltage regulator 32. The voltage regulator 32 is implemented using an NMOS device 42 that is arranged in a source follower configuration. Particularly, the bias signal 31 is operatively connected to a gate 44 of the NMOS device 42, Vdd 26 is operatively connected to drain terminal 46 of the NMOS device 42, and the 'virtual' power supply voltage 34 is operatively connected to a source terminal 48 of the NMOS device 42. This source follower configuration causes the source terminal 48 to be a pulled to voltage equal to a voltage of the bias signal 31 at the gate terminal 44 minus the threshold voltage of the NMOS device 42. For example, if the bias signal 31 is at 2 volts and the threshold voltage of the NMOS device 42 is 0.5 volts, the source terminal 48, and hence, the 'virtual' power supply voltage 34 will be at 1.5 volts.

Those skilled in the art will understand that, in one or more other embodiments, a biasing circuit using a structure other than a voltage divider may be used. For example, a biasing circuit may use active devices, bandgap references, etc. In other words, any biasing circuit that generates one or more bias signals is within the scope of the present invention.

When the voltage translator stage 36 draws current from the voltage regulator 32, the 'virtual' power supply voltage 34 at the source terminal 48 of the NMOS device 42 starts to decrease, which, in turn, causes the NMOS device 42 to switch 'on,' i.e., conduct more current, which, in turn, pulls up the voltage at the source terminal 48 of the NMOS device 42 back to the desired 'virtual' power supply voltage 34.

Figure 5:
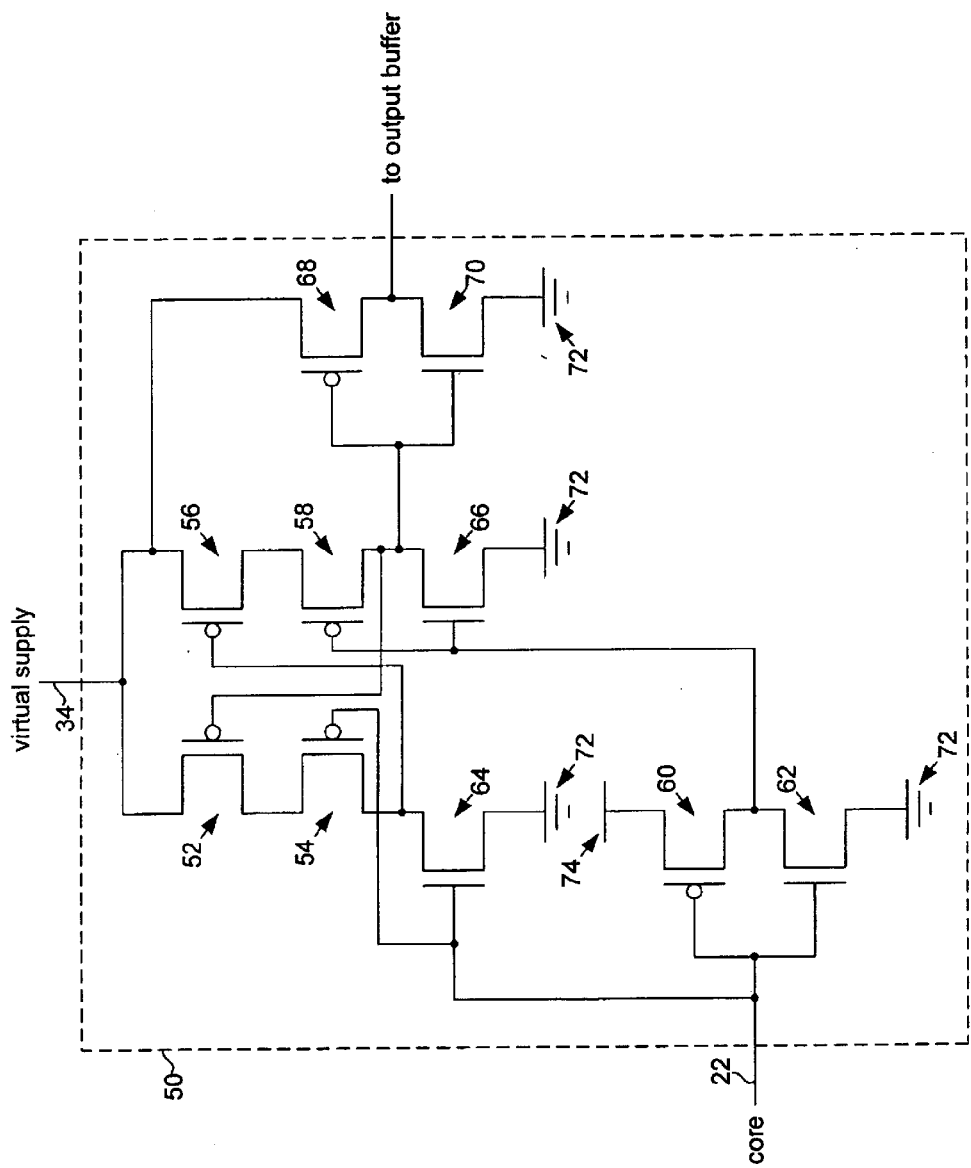
FIG. 5 shows a circuit diagram of a voltage translator in accordance with an embodiment of the present invention.

FIG. 5 shows a circuit diagram of an exemplary voltage translator 50 that may be used as part of the voltage translator stage 36 shown in FIGS. 3 and 4. The voltage translator 50 is made up of a differential stage formed by PMOS transistors 52, 54, 56, and 58, a first inverter formed by PMOS transistor 60 and NMOS transistor 62, NMOS transistor 64, NMOS transistor 66, and a second inverter formed by PMOS transistor 68 and NMOS transistor 70.

Core signal 22 serves as an input to the voltage translator 50. When core signal 22 goes 'high,' NMOS transistor 64 switches 'on,' which, in turn, causes an input to PMOS transistor 56 to get connected to 'low,' i.e., ground 72, via 'on' NMOS transistor 64. Moreover, when core signal 22 goes 'high,' NMOS transistor 62 switches 'on,' which, in turn, causes an input to PMOS transistor 58 to get connected to 'low' via 'on' NMOS transistor 62. Because both PMOS transistors 56 and 58 are 'on,' virtual supply voltage 34 (from the voltage regulator 32 shown in FIGS. 3 and 4) gets connected to an input of NMOS transistor 70, which, in turn, causes NMOS transistor 70 to switch 'on, which, in turn, causes the voltage translator 50 to output 'low' to the output buffer (not shown).

When core signal 22 goes 'low,' PMOS transistor 60 switches 'on,' which, in turn, causes the input to NMOS transistor 66 to get connected to 'high, i.e., Vdd 74 (I/O power supply voltage), via 'on' PMOS transistor 60. In turn, NMOS transistor 66 switches 'on' causing an input to PMOS transistor 68 to get connected to 'low' via 'on' NMOS transistor 66. When PMOS transistor 68 switches 'on,' the voltage translator 50 outputs virtual supply voltage 34 to the output buffer (not shown) via 'on' PMOS transistor 68.

Figure 6:
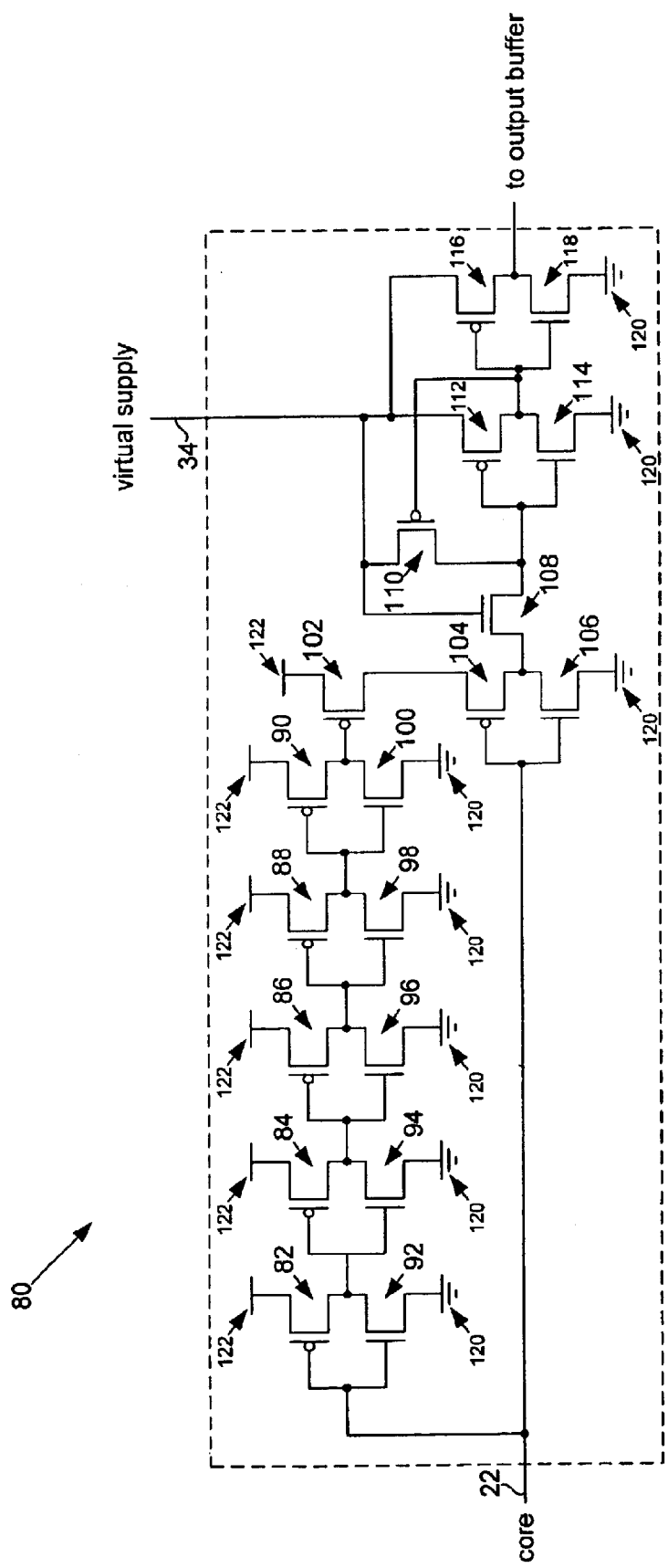
FIG. 6 shows a circuit diagram of a voltage translator in accordance with an embodiment of the present invention.

FIG. 6 shows a circuit diagram of another exemplary voltage translator 80 that may be used as part of the voltage translator stage 36 shown in FIGS. 3 and 4. The voltage translator 80 is made up of a delay chain formed by PMOS transistors 82, 84, 86, 88, and 90 and NMOS transistors 92, 94, 96, 98, and 100, PMOS transistor 102, an inverter formed by PMOS transistor 104 and NMOS transistor 106, NMOS transistor 108, PMOS transistor 110, an inverter formed by PMOS transistor 112 and NMOS transistor 114, and an inverter formed by PMOS transistor 116 and NMOS transistor 118.

Core signal 22 serves as an input to the voltage translator 80. When core signal 22 goes 'high,' NMOS transistor 106 switches 'on,' which, in turn, causes a 'low,' i.e. ground 120, to get passed through NMOS transistor 108 (which is 'on' due to its input being connected to virtual supply voltage 34) to an input of PMOS transistor 104 which, in turn, switches 'on' causing virtual supply voltage 34 to get connected to an input of NMOS transistor 118. In turn, NMOS transistor 118 switches 'on' causing the voltage translator 80 to output 'low' to the output buffer (not shown).

When core signal 22 goes 'low,' PMOS transistor 104 switches 'on.' Before the 'low' on core signal 22 can propagate down the delay chain formed by PMOS transistors 82, 84, 86, 88, and 90 and NMOS transistors 92, 94, 96, 98, and 100, the delay chain outputs 'low' to an input of PMOS transistor 102, which, in turn, causes PMOS transistor 102 to be 'on.' Because PMOS transistors 102 and 104 are 'on' for some finite amount of time, a 'high,' i.e., Vdd 122 (1/0 power supply voltage), passes through 'on PMOS transistors 102 and 104 and NMOS transistor 108 to an input of NMOS transistor 114, which, in turn, causes NMOS transistor 114 to switch 'on.' When NMOS transistor 114 switches 'on,' an input to PMOS transistor 116 gets connected to 'low' via 'on' NMOS transistor 114. Because the 'low' at the input of PMOS transistor 116 causes PMOS transistor 116 to switch 'on,' the voltage translator 80 outputs virtual supply voltage 34 to the output buffer (not shown) via 'on' PMOS transistor 116. Moreover, PMOS transistor 110 uses feedback from the input of the inverter formed by PMOS transistor 116 and NMOS transistor 118 to maintain a voltage at the input of the inverter formed by PMOS transistor 112 and NMOS transistor 114 when the voltage translator 80 is outputting the virtual supply voltage 34.

Advantages of the present invention may include one or more of the following. In one or more embodiments, because a SSTL pre-driver stage uses a voltage regulator to generate a 'virtual' supply voltage, low-voltage transistors, that would otherwise be damaged if directly operated off of a supply voltage of the pre-driver stage, may be used. Accordingly, performance may be increased without an increase in power consumption.

Because a voltage translator typically requires that its supply be equal to the voltage that is can translate to, translating at a high voltage with low-voltage transistors may cause circuit damage. Accordingly, in one or more embodiments of the present invention, because an appropriate regulated voltage is supplied to the translator, transistors and other circuitry are not susceptible to damage.

In one or more embodiments, because the buffering of a signal from a microprocessor uses an I/O power supply, the power supply of the microprocessor may be changed or designed independent of the buffering. In other words, the microprocessor power supply voltage may be changed without affecting the I/O interface.

In one or more embodiments, because a SSTL pre-driver stage uses a voltage regulator with a voltage translator, the pre-driver stage draws very little DC current, which, in turn, reduces power consumption.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
a biasing circuit arranged to generate a bias signal;
a voltage regulator arranged to receive the bias signal and generate a regulated voltage on a terminal thereof, wherein the regulated voltage is less than a power supply voltage of the voltage regulator, and wherein the biasing circuit operates independent of the regulated voltage; and
a voltage translator stage, operatively connected to the terminal, arranged to output a voltage dependent on an input thereto, wherein the regulated voltage is arranged to serve as a power supply for the voltage translator stage such that a maximum value of the output voltage from the voltage translator is substantially equal to the regulated voltage.

2. The integrated circuit of claim 1, wherein the voltage regulator comprises a device arranged in a source follower configuration.

3. The integrated circuit of claim 1, wherein the voltage regulator comprises a transistor, and wherein the terminal is a source terminal of the transistor.

4. The integrated circuit of claim 3, wherein a gate terminal of the transistor is operatively connected to the bias signal, and wherein a drain terminal of the transistor is operatively connected to the power supply voltage.

5. The integrated circuit of claim 1, wherein a maximum voltage of a signal outputted from the voltage translator stage is less than the power supply voltage.

6. The integrated circuit of claim 1, wherein the biasing circuit comprises a plurality of resistors connected in series.

7. The integrated circuit of claim 1, wherein the voltage regulator is arranged to maintain the regulated voltage on the terminal when the voltage translator stage draws current from the voltage regulator.

8. The integrated circuit of claim 1, wherein the biasing circuit, the voltage regulator, and the voltage translator stage are part of a stub series termination logic pre-driver circuit.

9. An integrated circuit, comprising:
means for generating a bias signal;
means for generating a regulated voltage dependent on the bias signal, wherein the regulated voltage is less than a supply voltage of the means for generating the regulated voltage, and wherein the means for generating the bias signal operates independent of the regulated voltage; and
means for outputting a signal dependent on an input to the means for outputting the signal, wherein the means for outputting the signal is dependent on the regulated voltage such that a maximum value of the signal is substantially equal to the regulated voltage.

10. The integrated circuit of claim 9, wherein the means for generating the regulated voltage comprises means for maintaining the regulated voltage.

11. A method for performing a stub series termination logic operation, comprising:
generating a bias signal dependent on a power supply voltage;
generating a regulated voltage dependent on the bias signal and the power supply voltage, wherein the regulated voltage is less than the power supply voltage, and wherein generating the bias signal is independent of the regulated voltage; and
generating an output signal dependent on an input signal, wherein the generating the output signal is dependent on the regulated voltage, such that a maximum value of the output signal is substantially equal to the regulated voltage.

12. An integrated circuit having a core and a memory, comprising:
stub series termination logic circuitry interfaced between the core and the memory, wherein the stub series termination logic circuitry is arranged to operate off of a power supply voltage, and wherein the stub series termination logic circuitry comprises:
a pre-driver stage arranged to receive an input signal from the core, wherein the pre-driver stage comprises:
a voltage regulator arranged to operate off of the power supply voltage and generate a regulated voltage on a terminal thereof, wherein the regulated voltage is less than the power supply voltage, and wherein the voltage regulator is controlled independent of the regulated voltage, and
a voltage translator stage, operatively connected to the terminal, arranged to output an output signal dependent on the input signal and the regulated voltage such that a maximum value of the output signal is substantially equal to the regulated voltage, and
an output buffer stage arranged to receive and buffer the output signal.

13. The integrated circuit of claim 12, wherein the voltage regulator comprises a device arranged in a source follower configuration.

14. The integrated circuit of claim 12, wherein the voltage regulator comprises a transistor, and wherein the terminal is a source terminal of the transistor.

15. The integrated circuit of claim 14, wherein a drain terminal of the transistor is operatively connected to the power supply voltage.

16. The integrated circuit of claim 12, wherein the pre-driver stage further comprises a biasing circuit arranged to produce a bias signal to the voltage regulator.

17. The integrated circuit of claim 16, wherein the biasing circuit comprises a plurality of resistors connected in series.

18. The integrated circuit of claim 16, wherein the voltage regulator comprises transistor, and wherein the bias signal is operatively connected to a gate terminal of the transistor.

19. The integrated circuit of claim 12, wherein a maximum voltage of the output signal is less than the power supply voltage.

20. The integrated circuit of claim 12, wherein the voltage regulator is arranged to maintain the regulated voltage on the terminal when the voltage translator stage draws current from the voltage regulator.

* * * * *